United States Patent [19]
Aoyama et al.

[11] Patent Number: 5,294,811
[45] Date of Patent: Mar. 15, 1994

[54] THIN FILM SEMICONDUCTOR DEVICE HAVING INVERTED STAGGER STRUCTURE, AND DEVICE HAVING SUCH SEMICONDUCTOR DEVICE

[75] Inventors: Takashi Aoyama, Ibaraki; Kazuhiro Ogawa, Hitachi; Yasuhiro Mochizuki, Katsuta; Naohiro Momma; Katsuhisa Usami, both of Hitachi, all of Japan

[73] Assignee: Hitachi, Ltd., Tokyo, Japan

[21] Appl. No.: 801,350

[22] Filed: Dec. 2, 1991

[30] Foreign Application Priority Data

Nov. 30, 1990 [JP] Japan ............................. 2-329054
Mar. 15, 1991 [JP] Japan ............................. 3-051270

[51] Int. Cl.$^5$ .................... H01L 29/04; H01L 27/01; H01L 31/036
[52] U.S. Cl. ......................... 257/59; 257/57; 257/66; 257/72; 257/347
[58] Field of Search ............ 357/2, 4, 23.7, 30; 257/57, 59, 66, 72, 347, 350

[56] References Cited

U.S. PATENT DOCUMENTS

| | | | |
|---|---|---|---|
| 5,040,875 | 8/1991 | Noguchi | 357/23.7 |
| 5,075,746 | 12/1991 | Hayashi et al. | 357/23.7 |
| 5,142,344 | 8/1992 | Yamazaki | 357/23.7 |

FOREIGN PATENT DOCUMENTS

| | | | |
|---|---|---|---|
| 60-98680 | 6/1985 | Japan | 357/23.7 |
| 62-295465 | 12/1987 | Japan | 357/4 |
| 2-83981 | 3/1990 | Japan | 357/23.7 |
| 2-208635 | 8/1990 | Japan | 357/23.7 |
| 2-238666 | 9/1990 | Japan | 357/23.7 |
| 3-80569 | 4/1991 | Japan | 357/23.7 |

OTHER PUBLICATIONS

IEEE Transaction on Electron Device, 36, pp. 2868–2872 (1989) "High–Performance TFT's Fabricated by XeCl Excimer Laser Annealing of Hydrogenated Amorphous–Silicon Film" by Sera et al.

*Primary Examiner*—Rolf Hille
*Assistant Examiner*—Steven Loke
*Attorney, Agent, or Firm*—Antonelli, Terry, Stout & Kraus

[57] ABSTRACT

TFTs with an inverted stagger structure are fabricated according to the invention as follows; a glass substrate after depositing amorphous silicon (a-Si) thereupon is transferred to a laser annealing chamber which is kept in non-oxidation ambient and provided with a sample holder and a substrate heating mechanism. The substrate is fixed on the sample holder, then subjected to laser annealing while being heated from the glass substrate side, thereby growing polycrystalline silicon having substantially improved crystallinity, on which a-Si is further deposited. According to this process of the invention, it is capable of forming TFTs having a higher mobility and a smaller leakage current in the periphery of the substrate, with addition of almost no changes to the process and device structures of conventional TFTs which constitute pixels, and even more the peripheral drive circuitry is capable of being integrated in the display substrate.

24 Claims, 7 Drawing Sheets

(PERIPHERAL CIRCUITRY TFT)    (PIXEL TFT)

THIN FILM SEMICONDUCTOR DEVICE HAVING INVERTED STAGGER STRUCTURE, AND DEVICE HAVING SUCH SEMICONDUCTOR DEVICE

BACKGROUND OF THE INVENTION

The present invention relates to a thin film semiconductor device, and in particular, to a thin film transistor having an inverted stagger structure to be applied to liquid crystal display devices, its fabrication method, and image processor devices.

As thin film transistors (TFTs) applied to liquid crystal display devices, there have been amorphous silicon (a-Si) TFTs having inverted stagger structures. On the other hand, there have been some attempts to improve the carrier mobility in TFTs, such as set forth in the Japanese Patent Publication No.59-15524 (1984) where TFTs having a coplanar structure with an a-Si film being formed under a p-Si (polycrystalline silicon) film were used, or in Japanese Patent Publication No.62-295465 (1987) where an a-Si layer was provided between the source and drain regions, and the channel region (p-Si layer). Further, a laser annealing method for realizing a two-layer structure of a-Si and p-Si by laser annealing part of the a-Si film into p-Si was described in IEEE Trans. Electron Dev.36,2868-2872 (1989).

In these prior arts, however, annealing had been conducted in vacuum or inert gas, with temperatures of the substrates set at room temperatures. By laser annealing in vacuum or inert gas, adverse effects due to oxygen and water or harmful impurity atoms in the air are reduced, preventing formation of oxide films or the like on the surface. However, such a method which employs normal stagger structures is not suitable for application to the liquid crystal display devices as its process increases requiring light-shutter films or the like. In addition, although some improvement has been made in the carrier mobility, as part of the film being changed to p-Si by laser annealing, the interface between a p-Si layer and an a-Si layer cannot be made smooth. Furthermore, the p-Si layer consists of an upper region having a fairly large crystal grain size, a middle region having a small crystal grain size, and a lower region having an irregular boundary. Therefore, when a reverse voltage is applied to the gate, electric field is concentrated on the irregular boundary, giving rise to a problem to cause a large leakage current. Hence, there occurred a problem that peripheral driver circuits could not be integrated in a display substrate. Furthermore, although there were given some considerations against contamination due to inclusion of oxygen atoms, carbon or other impurities into thin films during laser annealing or for preventing formation of oxide films, no effective measures have been taken to assure homogeneity of crystal grains in polycrystalline semiconductor thin films obtained, or with respect to a distribution of crystal grains in a perpendicular direction, thereby giving rise to a problem that the electrical properties became varied.

SUMMARY OF THE INVENTION

An object of the present invention is to provide for a TFT structure capable of reducing both off-currents (I(off)) and reverse leakage currents while retaining a high carrier mobility, i.e., without lowering TFT's on-current, eventually capable of integrating a peripheral circuits to drive, in addition, providing for a method of its fabrication, its fabrication equipment, and image processing equipment incorporating such devices.

Another object of the invention is to provide polycrystalline semiconductor films having minimized variations in their electrical properties.

In order to accomplish the abovementioned objects, a fabrication method for fabricating TFTs with an inverted stagger structure as follows has been employed in the present invention. Namely, the fabrication method for fabricating TFTs with the inverted stagger structure is characterized in that, after depositing a gate electrode and gate insulator film, a polycrystalline silicon layer is formed, then source and drain regions including an layer are formed. The above polycrystalline silicon layer is capable of being readily formed by irradiating a laser beam on an amorphous silicon layer which was deposited on a glass substrate or the like. More efficient power beam irradiation will be effected when conducted in high thermal conductivity gases such as hydrogen, helium or the like.

In order to accomplish the above objects, a TFT with an inverted stagger structure according to the present invention has been formed as follows. That is, a channel region of a TFT with an inverted stagger structure has a two-layered structure of p-Si and a-Si, the former in contact with a gate insulator film, and both p-Si and a-Si layers in contact with each other via a fairly smooth interface.

Further, in order to accomplish the above objects, thin film semiconductor fabrication equipment according to the present invention has an arrangement so that four layers of a gate insulator layer, polycrystalline layer, amorphous layer and n-type, layer are capable of being formed consecutively retained in vacuum.

By means of a fabrication method for fabricating TFTs with inverted stagger structure according to the present invention, the channel region is formed in such a manner that p-Si is formed at first, then is formed a-Si. Namely, as a p-Si layer having a higher process temperature than that of an a-Si layer is formed prior to forming a-Si, a two-layered structure of p-Si and a-Si is capable of being obtained without degrading characteristics of the a-Si layer. In contrast, should a p-Si film be deposited after the deposition of an a-Si film, or should portion of the a-Si film be changed to p-Si film through laser annealing or the like, a-Si in the vicinity of the interface would be thermally affected, degrading electrical properties, in particular, resistivity, due to removal of hydrogen contained in the a-Si film or due to recrystallization with finer grain sizes. In contrast, when an a-Si film is formed after a p-Si film was formed, a two-layered structure with a smoother interface is capable of being obtained. When the process of film formation is reversed, likewise the above, an interface between a-Si and p-Si cannot be made smooth, the same being affected thermally thus resulting in an irregular interface.

When irradiation with power laser beams or the like is conducted in a highly thermal conductivity gas such as hydrogen, helium and so on, crystallization in a film proceeds not only from an interface between the film and an underlying insulator film, but also from the side of the surface of the film, thereby permitting the film to have much improved crystallization. Further, there has been provided means for providing temperature gradients so that temperatures at a substrate side become higher and those at the surface of a semiconductor film become lower during laser annealing.

As means for providing the above temperature gradients, there are relevant methods such as heating the substrate during laser annealing, utilizing non-oxidizing gases with higher thermal conductivities for irradiation ambient, injecting the above non-oxidizing gases which were precooled, and combinations of these. Further, as another means for providing the above temperature gradient, a substrate heating mechanism and/or a gas cooling mechanism for cooling gases to be introduced into a chamber may be incorporated into the laser annealing equipment.

First, when fabricating films utilizing the above laser annealing equipment, in case of fused solidification by irradiating a laser beam on the surface of an amorphous silicon film, cooled solidification proceeds initiated at a boundary region inside the film where the fused portion and the portion not fused by laser irradiation meet eventually extending up to the outmost surface layer. By keeping the silicon film surface layer at low temperatures and the substrate side at higher temperatures, chilled solidification takes place from the surface of the silicon film. Thereby, crystallization is effected to take place from a free surface without being affected by an irregular interface between the film and that underneath, with a grain size in the upper portion of the silicon film being homogeneous and large-sized. Further, by heating the substrate, the cooling rate in the lower portion of the silicon film is slowed, thereby enabling a larger grain size to be formed even in the lower portion of the silicon film.

For TFTs having an inverted stagger structure fabricated according to the present invention, when the transistor is turned on by applying forward voltage to the gate electrode, an inversion layer (accumulation layer) is formed in p-Si which has a high carrier mobility, accordingly, a large on-current is capable of being obtained because of the stagger structure and a large overlap portion thus provided between the inversion layer (accumulation layer), the source and the drain, even in a case with a double structure of a-Si and p-Si. A thickness of the inversion layer in the p-Si film is larger than that of a single crystal, which contributes to the large on-current. Thereby, a film thickness of p-Si is preferably greater than 100Å.

When no gate voltage is applied, and since the p-Si layer with low resistivity is capable of being formed into a thinner film, its off-current (Ioff) is capable of being reduced as small as the level of conventional a-Si TFTs. A thickness of the p-Si layer is preferably less than 500Å.

When a reverse voltage is applied to the gate electrode, and since there exists an a-Si layer having a smooth interface against the p-Si, between the accumulation layer (inversion layer) formed in the p-Si and the n layer, the electric field thereof is relaxed thereby suppressing reverse leakage current (Irev). If the interface between the p-Si and a-Si layers is not smooth, the electric field will be concentrated along the irregularity portion even if provided with a stagger structure, thus failing to suppress Irev. Irregularities between the p-Si and a-Si layers are preferably less than 50Å per 1000Å in a horizontal direction.

Thin film semiconductor fabrication equipment according to the present invention provides the following functions. Namely, it is capable of not only forming a gate insulator film, p-Si layer, a-Si layer and n layer consecutively in this sequence, but also is capable of preventing oxidation effects, in particular, in the interfaces between the gate insulator film and p-Si layer, and between p-Si layer and a-Si layer, hence attaining an improved carrier mobility and threshold voltage.

BRIEF DESCRIPTION OF THE DRAWINGS

FIG. 10 shows the results of evaluation by X-ray diffraction of TFTs of the invention with respect to crystallization vs film thickness.

DESCRIPTION OF THE PREFERRED EMBODIMENTS

The principle of the present invention will be described in the following with reference to FIG. 1.

Figure 1:
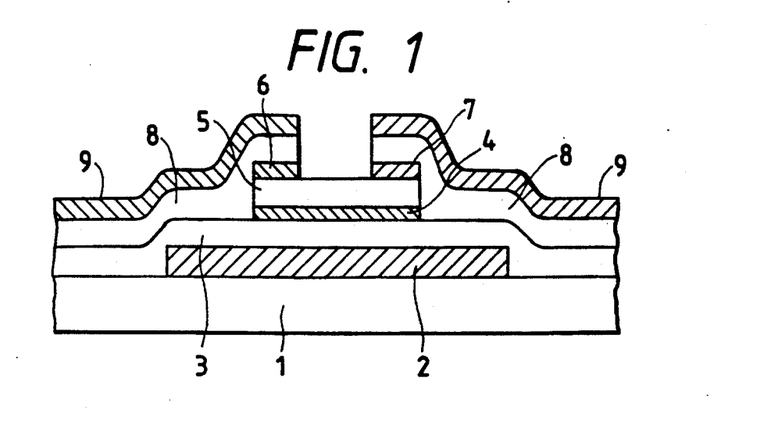
FIG. 1 is a cross-sectional diagram of a TFT with an inverted stagger structure according to the present invention.

FIG. 1 is a cross-sectional view of a semiconductor device showing a structure of the present invention.

In FIG. 1, numerals 1 indicates an insulator substrate, 2 indicates a gate electrode, 3 indicates a gate insulator film, 4 indicates a polycrystalline silicon layer, 5 indicates an amorphous silicon layer, 6 indicates a source, 7 indicates a drain, 8 indicates a Cr electrode, and 9 indicates an Al electrode.

The structure of the present invention is accomplished firstly by depositing a gate electrode and gate insulator film on the surface of an insulating substrate, then forming a polycrystalline silicon layer (p-Si layer) thereupon, which is followed by deposition of amorphous silicon layer (a-Si), then forming source and drain regions including n layer, lastly forming Cr electrode and Al electrode, respectively.

Because of such a structure, wherein a p-Si layer of which the process temperature is higher than that of an a-Si layer is formed prior to the a-Si layer, the interface between the a-Si and p-Si layers is capable of being made smoother thereby yielding a large on-current, at the same time reducing the off-current approximately to the same level as that of conventional a-Si TFTs.

Next, a preferred embodiment of the present invention will be described in the following with reference to FIG. 2. The same numerals as in FIG. 1 indicate the same members.

This preferred embodiment of the invention is for application in realizing a video display terminal (VDT) with a screen of a diagonal length of 10 in. The display screen has 480×640×(3) pixels. TFTs used in the display screen have a conventional inverted stagger structure, and TFTs used in the peripheral circuits have a two-layer structure of p-Si and a-Si in the channel region.

First, Cr films 2 are deposited on the surface of a glass substrate 1 with a diagonal length of 12 in. to a thickness of 3000Å through sputtering. After patterning gate electrodes 2, gate insulator film 3 of SiN is deposited thereupon to a thickness of 2500Å through the plasma CVD method. Then, an a-Si film 5 is deposited thereupon to a thickness of 200Å by the plasma CVD method.

Then, in a portion on the substrate where peripheral circuits are to be formed, excimer laser is irradiated on the a-Si film at power densities of 280mJ/cm² in an He atmosphere to transform the same to p-Si film 4a. Subsequently, an a-Si film 5 is deposited thereupon to a thickness of 2000Å by the plasma CVD method. In the peripheral drivers circuits portion, a two-layer structure of p-Si (200Å) and a-Si (2000Å) is provided while pixel portion, a monolayer structure of a Si (2200Å) is provided. According to the above fabrication method, irregularities in the surfaces of p-Si and a-Si layers are capable of being controlled within 50Å per 1000Å in a horizontal direction. Then, a-Si (n layer) 6, 7 are deposited to a thickness of 300Å through the plasma CVD method. After etching the Si layer to define island patterns, a transparent electrode ITO is deposited through the sputtering method, which is then patterned by the photoetching process. After that, Cr 8, Al 9 are deposited through the sputtering method. The source and drain regions are separated by the photo-etching process, then an overcoat passivation film 10 is formed, hence accomplishing a TFT having an inverted stagger structure. Characteristics as shown in FIG. 3 are obtained for the TFT which will be detailed in the following. In the peripheral circuits, carrier mobility: 50 cm²/Vs, threshold voltage: 3V, off-current: $2\times10^{-12}$A, reverse leakage current: $5\times10^{12}$A (Vg=−5V). In the pixel portion, carrier mobility: 0.4cm²/Vs, threshold voltage: 1.5V, offcurrent: $1\times10^{-12}$A. Further, by forming a polarizer, color filters and transparent electrodes on another glass substrate with a diagonal size of 12 in., and injecting liquid crystal to be hermetically sealed into a gap between the same and the previously prepared substrate, there is accomplished 10 in. size VDT display equipment.

Figure 4:
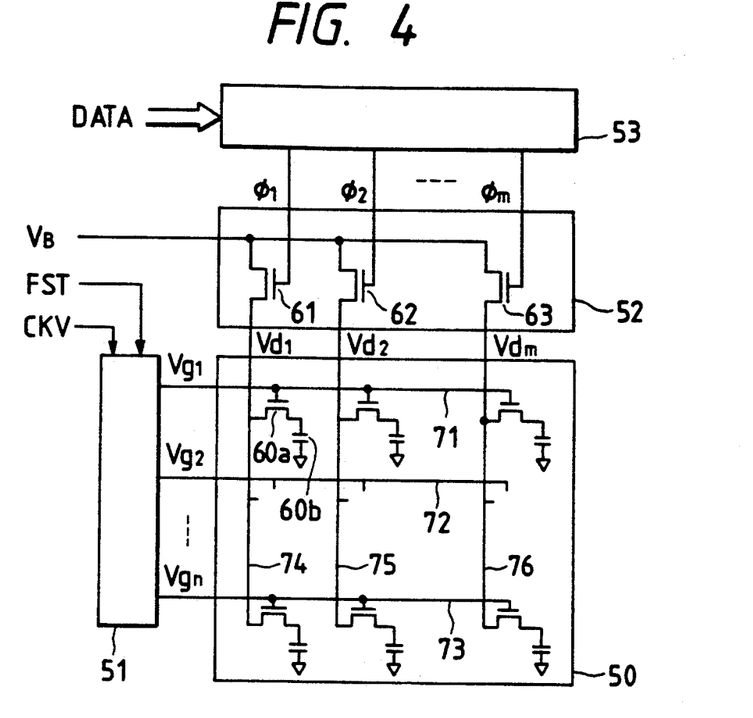
FIG. 4 is an overall schematic block diagram showing a TFT liquid crystal panel of the invention.

The overall structure of a liquid crystal display device utilizing the above-mentioned thin film devices is shown in FIG. 4. The display device is comprised of a TFT liquid crystal panel 50, scanning circuits 51, sampling circuits 52 serving as time function/intermediate conversion means, and a sampling control circuits serving as digital/time function converter means Scanning signals from the scanning circuits 51 are given to respective liquid crystal display elements in the liquid crystal panel 50 via scanning lines 71 through 73, while sampling signals from the sampling circuits 52 are given to the same via signal lines 74 through 76. In this structure, the TFT according to the present invention corresponds to a switch 60a in the TFT liquid crystal panel 50 whereas the liquid crystal element does to 60b. Further, switches 61 through 63 in the sampling circuits 52 or switching elements in the scanning circuits 51 may also be composed of TFTs of the invention.

In the following, operation of the device of FIG. 4 will be briefly described. FST signals and CKV signals are input to the scanning circuits 51 as timing signals. According to these signal inputs scanning signals $V_{g1}$ through $V_{gn}$ are output.

On the other hand, digital data signals (data) to define display conditions for the liquid crystal display are input to the sampling control circuits 53, which are converted to sampling signals $\phi_l$ through $\phi_m$ to be put out.

Amplitude of sampling signals $\phi_l$ through $\phi_m$ is determined by the logic levels of switches which compose the sampling control circuits 53. For instance, in case of MOS switches, it will be from 0 to 5 V. The amplitude of the sampling signals $\phi_l$ through $\phi_m$ is substantially the same as that of the digital data signal, for instance, from 0 to 5 V, which equals the input signal to the sampling control circuits 53.

Through the sampling circuits 52, in compliance with the timing of sampling signals $\phi_l$ to $\phi_m$, brightness reference signal $V_B$ is applied to the liquid crystal elements.

Figure 5:
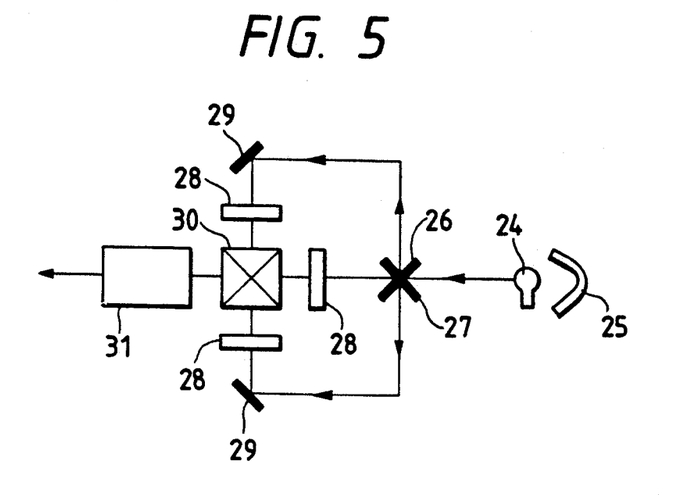
FIG. 5 is a schematic diagram of a projection display embodying the present invention.

Further, another embodiment of the thin film semiconductor device of the invention as applied to a projection type display is shown in FIG. 5.

In FIG. 5, numerals 24 indicates a light source, 25; a concave mirror, 26 and 27; color splitter optical systems, 9; reflecting mirrors, 28; liquid crystals, 30; color recombining optical system, and 31; a projection lens.

The operation of this equipment is as follows.

White light emitted from the light source 24 is converged on the concave mirror 25 to an approximately collimated beam (using lens if necessary), then the same is split with respect to color components in the color splitter optical system 26 wherein blue color component is directed downward, red color component is directed upward and green component is directed to advance straightforward. The red and blue beams of light reflected via the reflection mirrors 29, and the straightforward green beam of light are injected into liquid crystal elements 28, respectively therein to be modulated to each image corresponding to respective color image components. Each beam of light passing through respective liquid crystal elements 28 is recombined into a full color single beam of ray in the color recombiner 30, which is then projected through the large projection lens 31 onto a screen and the like not shown here.

Further, a projection area for the above liquid crystal elements 28 is 3 inches in a diagonal size with 1440×1032 pixels, and they utilize TFTs having an inverted stagger structure with a two-layer of p-Si and a-Si in the channel region for both of the pixel portion and peripheral drivers circuits portion.

The fabrication process for the above liquid crystals is almost the same as that for the preceding 10 in. VDT of the first embodiment of the invention excepting that excimer laser was irradiated both on the pixel portion and the peripheral portion, i.e., all over the substrate surface, to form TFTs with a two-layer structure of p-Si and a-Si even in the pixel portion. When sealing liquid crystal into a gap provided between another glass substrate, three panes of color filters for R, G, B are provided, so as to complete three sets of liquid crystal sealed-in substrates. In the projector, the beam of light from the light source is split into three components of R, G, B; and in each course of respective beams of light, there is provided a corresponding liquid crystal sealed-in substrate. In the final stage, the three beams of light are recombined into a single ray of light to be projected onto the display screen through the projection lens.

Figure 6:
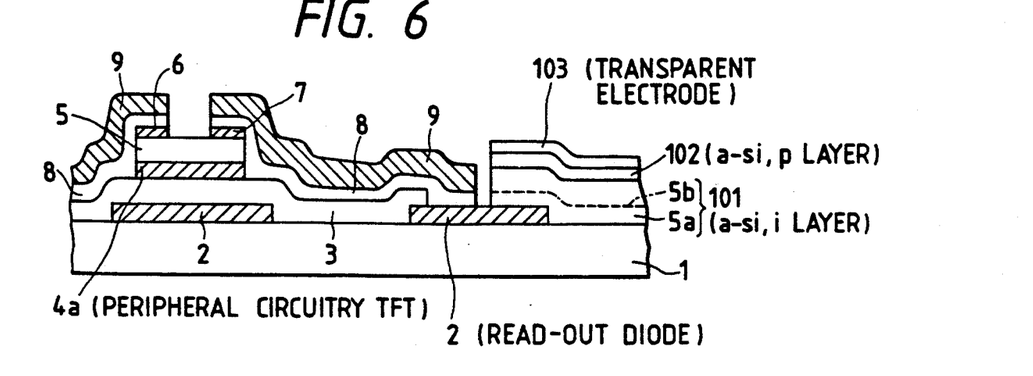
FIG. 6 is a schematic diagram of an image sensor of another embodiment of the invention.

Still another embodiment of the invention will be described below with reference to FIG. 6.

This example embodying the present invention pertains to an image sensor having a built-in peripheral circuit. One of the major differences from that of FIG. 2 is in portion for the read-out diode, and the other great difference is in that, although the embodiment of FIG. 2 has a structure of sealing liquid crystal in a gap between the substrate of the TFT with the inverted stagger structure and another substrate for mounting transparent electrodes, this embodiment of the invention requires none of such liquid crystal. The read-out diode is formed concurrently with TFTs for the peripheral circuits using the same process. Namely, the read diode is not subjected to the laser annealing, instead, a-Si 5a and a-Si 5b are combined to serve as an i-layer. Upon the i-layer, p type a-Si layer 102 is deposited, then a transparent electrode 103 is deposited thereupon, thus completing its fabrication process.

Figure 2:
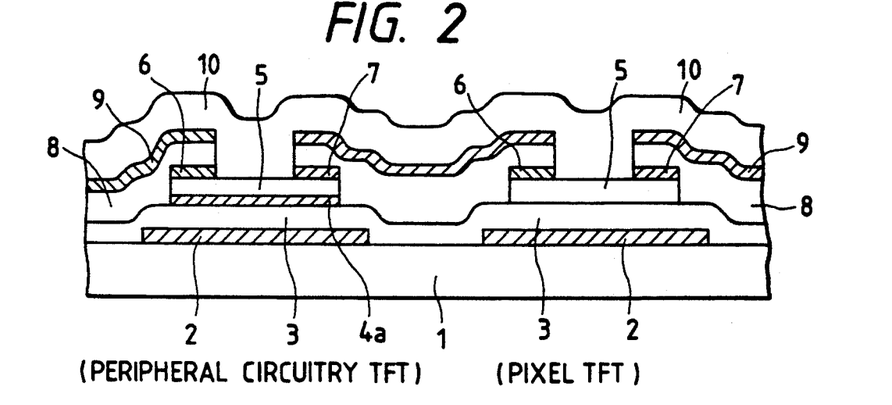
FIG. 2 is a cross-section of FIG. 1 of the invention.
Figure 3:
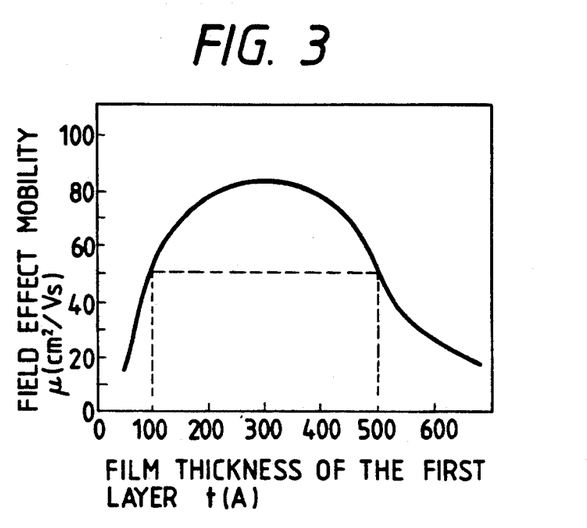
FIG. 3 shows characteristics of the TFT of FIG. 1.

In this image sensor of the invention, a reverse bias is applied between the transparent electrode 103 and an electrode 2 in the lower portion (which corresponds to the gate electrode in FIG. 2). When light enters the diode, a current is permitted to flow, thereby lowering the electrical potential at the electrode 2 in the lower portion, which lowering is detected by the peripheral circuits TFT.

This image sensor is capable of reading a document of A4 size within approximately 60 sec. The size of its substrate is 6 mm, and four driving TFTs per read element are connected thereupon. This preferred embodiment of the invention utilizes a two-layered inverted stagger structure of p-Si and a-Si for TFTs in the peripheral circuitry. The process for the fabrication is basically the same as that for the first embodiment of the invention. The thickness of each film is as follows. Gate electrode: 1000Å, gate insulator film: 3500Å, p-Si layer: 200Å, a-Si layer: 2600Å, Cr: 500Å, and Al: 5000Å.

In the above second and the third embodiments of the invention, part or the whole portion of the peripheral circuits is capable of being provided externally.

Figure 7:
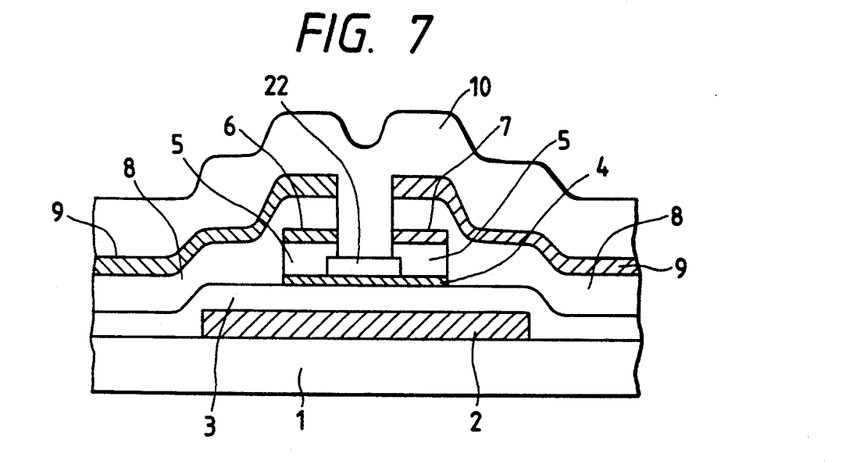
FIG. 7 is a cross-section of a TFT of still another embodiment of the invention.

Still another embodiment of the invention will be described below with reference to FIG. 7. In this embodiment of the invention, after a p-Si layer is formed, an SiN layer is deposited. When forming a source and drain after having patterned this SiN layer, the a-Si layer is also separated. This preferred embodiment of the invention according to this method of fabrication is particularly advantageous for reducing the off-current in such applications where no gate voltage is applied, thereby reducing the same as small as $7 \times 10^{-13}$A.

In the following, this preferred embodiment of the invention will be described with reference to FIG. 7.

The process of fabrication of this preferred embodiment of the invention is the same as that of the semiconductor device of FIG. 2 as far as the laser annealing step. Afterward that, however, an insulator film (SiN) 22 is deposited thereupon. After defining the pattern of the insulator film 22, an a-Si film 5 and n a-Si film 6 are deposited thereupon. After forming the Si layer into island patterns, electrodes of Cr 8 and Al 9 are deposited. Then, source and drain regions are formed through the photo-etching process. During the fabrication process, ends of the a-Si layer 6 are permitted to be obtained readily by means of the insulating substance 22, facilitating the etching process thereof. Although a sheet of mask for photo etching the insulating substance 22 is necessary to be added in this embodiment, because the a-Si layer 5 is separated between the source and drain in contrast to FIG. 1, the leakage current is capable of being reduced furthermore.

Further, laser annealing of the a-Si film of 200Å to change the same to p-Si in order to suppress the threshold voltage in TFTs of this embodiment of the invention is carried out in a boron ambient to dope boron thereinto, thereby rendering the same a p— type (x type) layer. In this case, even if inverted stagger TFTs of conventional types are utilized in the pixel portion, the threshold voltage of the peripheral circuits TFTs is capable of being controlled without affecting TFTs in the pixel portion.

In the following, fabrication equipment and a method of fabrication of the above thin film semiconductors of the invention will be set forth.

Figure 8:
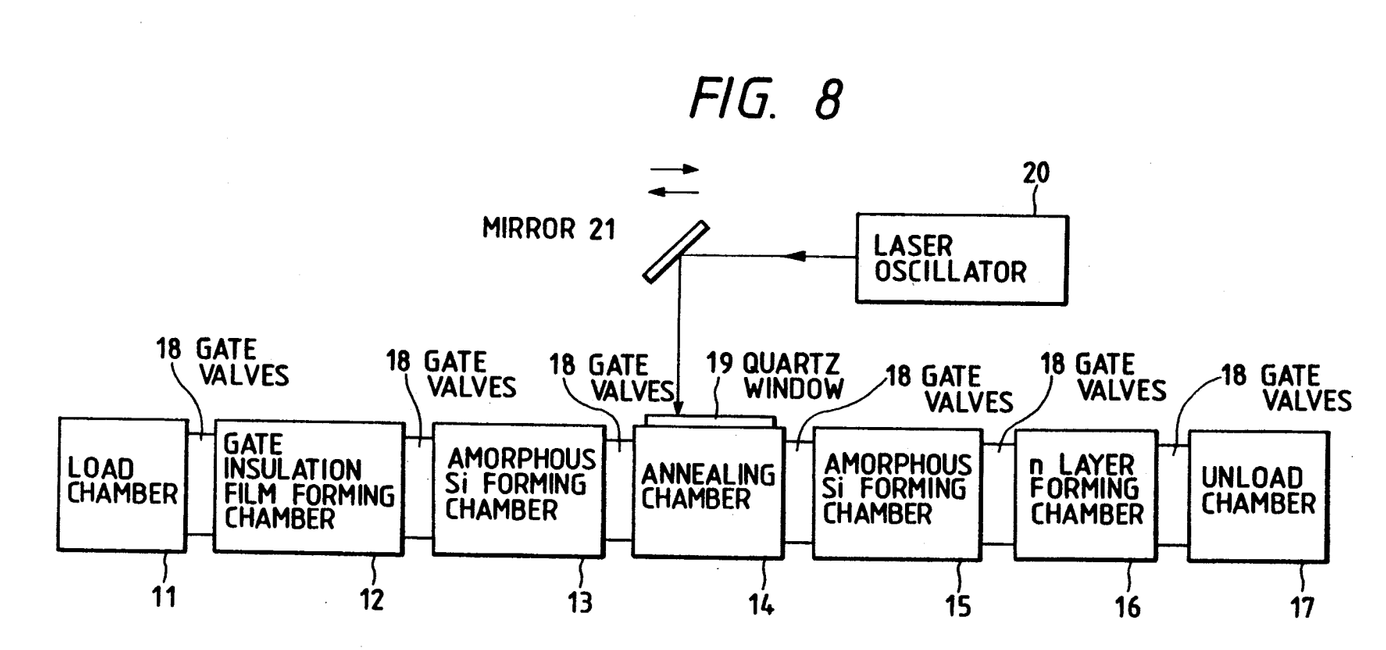

FIG. 8 illustrates one of the preferred embodiments of semiconductor fabrication equipment suitable for fabricating the semiconductor equipment of the first embodiment of the invention.

This preferred embodiment of the equipment comprises five reaction chambers indicated by numerals 12, 13, 14, 15 and 16, a loading chamber 11 and an unloading chamber 17, and gate valves for connecting respective chambers therebetween. A glass substrate loaded in the loading chamber 11 evacuated to $1 \times 10^{-5}$ Torr is subjected to SiN growth thereupon in the first reaction chamber 12. Then, in the second reaction chamber 13, a thin a-Si layer is formed thereupon. Then, the same is transferred to the third reaction chamber 14. To the upper portion of this chamber 14, a quartz window is attached, through which an excimer laser beam generated in a laser oscillator 20 and reflected on a full reflection mirror 21 is capable of being irradiated toward the surface of the sample. The mirror 21 is capable of moving in parallel in rows and columns so that any part of the a-Si film on an arbitrary position of the glass substrate is capable of being transformed into a p-Si film. The laser annealing is preferably conducted in He because, when conducted in He, a better crystallization of p-Si is obtained than that obtained in vacuum. This is probably because that recrystallization under laser annealing occurs not only from the substrate side but also from the film surface side. Next, an a-Si film in the reaction chamber 15 and an a-Si (n) layer in the reaction chamber 16 are capable of being deposited, respectively. Lastly, the sample is returned to the atmosphere in the unload chamber 17. By means of this fabrication equipment of the invention, not only it is possible to fabricate the semiconductor devices through a single continuous process, but also it is capable of providing the same having a carrier mobility of 65 cm$^2$/Vs, and a threshold voltage of 2.5 V.

Figure 9:
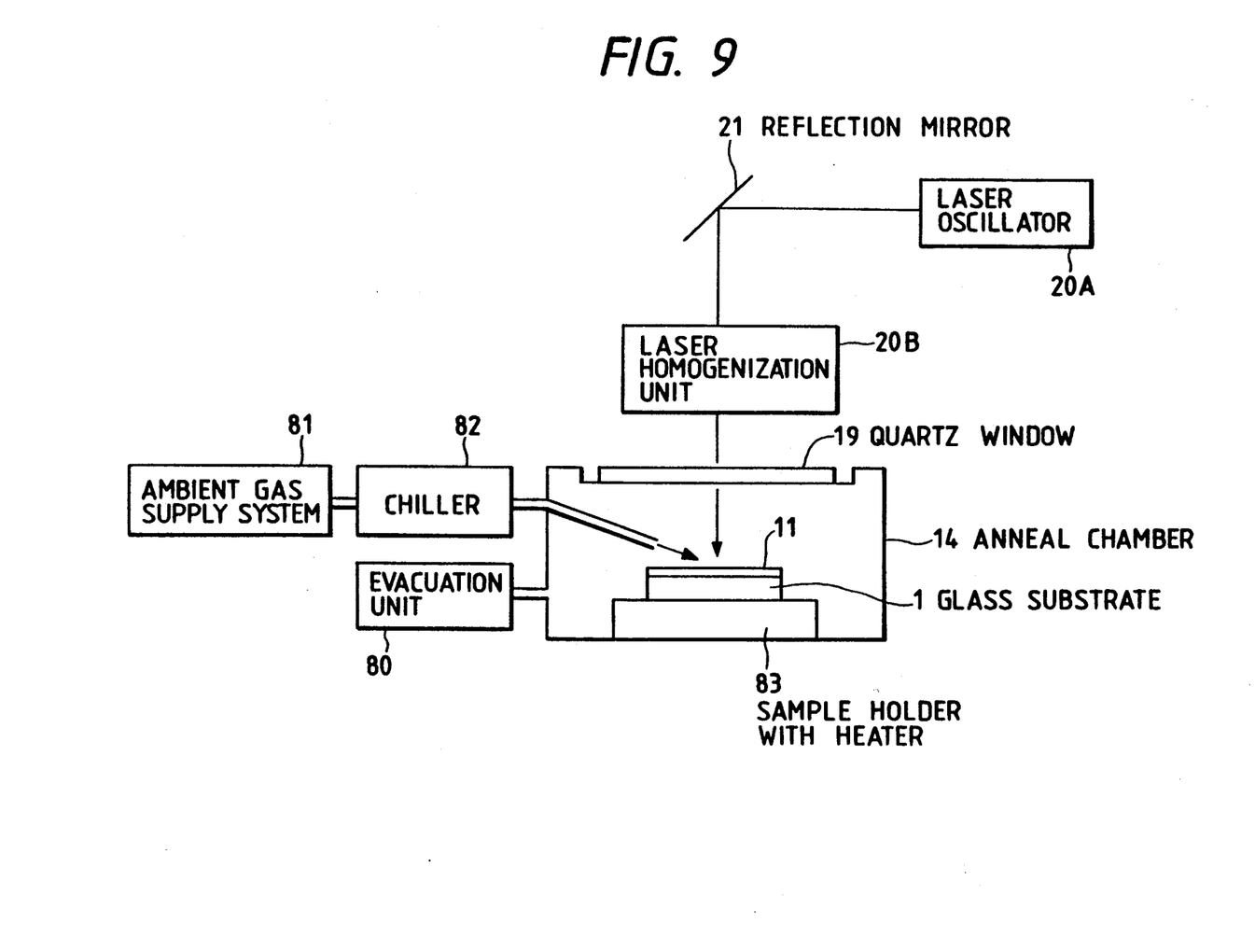
FIG. 9 shows details of the third reaction chamber of FIG. 8.

A construction of the third reaction chamber to carry out laser annealing, and the fabrication process thereof, will be described in detail in the following.

FIG. 9 illustrates key components of the laser anneal equipment. This equipment comprises: an anneal chamber 14 provided with a quartz window 19; a vacuum evacuation system 80 thereof; an ambient gas supply system 81 for supplying ambient gas to the above anneal chamber 14; a chilling mechanism 82 provided between the above ambient was supply system 81 and the above anneal chamber 14 for cooling the ambient gas; and a laser system for irradiating a laser beam into the above anneal chamber 14. In the anneal chamber 14, an x-y-z stage and a sample holder 83 attached to the stage with heating mechanism are installed. The laser system comprises a laser oscillator 20A for generating XeCl excimer laser beams, a mirror 21, and a beam homogenizing mechanism 20B.

Next, an example of the preferred fabrication processes of the invention will be given. A glass substrate 1 on which an amorphous silicon film was deposited by the LP-CVD method or the like to a thickness of 100 nm is mounted on a sample holder 83. The substrate is then heated to 300° C. by the substrate heating mechanism. Then, the reaction chamber is evacuated to 1 mPa of pressure. Then, helium (He) having a superior heat conductivity to that of argon or neon is injected into the anneal chamber 14 to one atmospheric pressure (approximately 101325 Pa) via the ambient gas supply system 81. Afterwards, XeCl excimer laser is irradiated onto the surface of the sample for laser annealing. The laser annealing conditions for the embodiments of the invention were as follows. The laser oscillation frequency wave length: 308 nm, pulse width: 28 nm, and irradiation power density: 250 mJ/cm$^2$. During this annealing, a temperature gradient was introduced in the amorphous silicon film so that the substrate side became higher and the surface side became lower, which was effected by the He gas existent in the ambient and heating of the substrate.

Microscopic photographs of cross-sections of polycrystalline silicon films of TFTs obtained through the above annealing process of the invention have revealed that the silicon films on the whole were composed of uniform crystal grains having approximately 100 nm grain sizes. With respect to the crystallization property, in comparison of X-ray diffraction strengths of laserannealed crystals obtained in air without heating the substrate and that obtained according to the process of the present invention, the diffraction strength of the latter was found to be approximately 1.5 Kcps which was almost twice as large as that of the former which was approximately 0.8 Kcps. This indicates that the latter has compacter crystal grains. As set forth above, by means of the embodiment of the invention, it has been possible to provide polycrystalline silicon films with a superior crystallinity having a uniform crystalline grain size as well as a denser distribution of such crystal grains.

Figure 10:
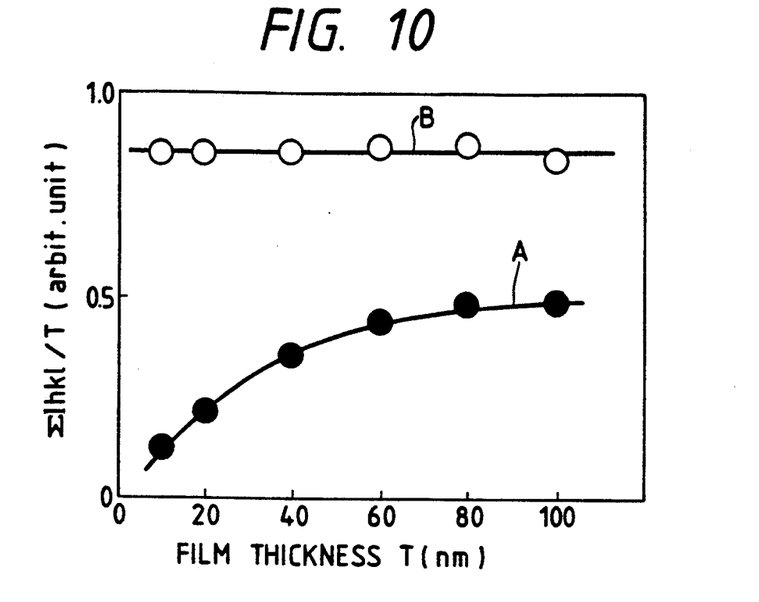
FIG. 10 shows thin film semiconductor fabrication equipment embodying the invention.
Figure 11:
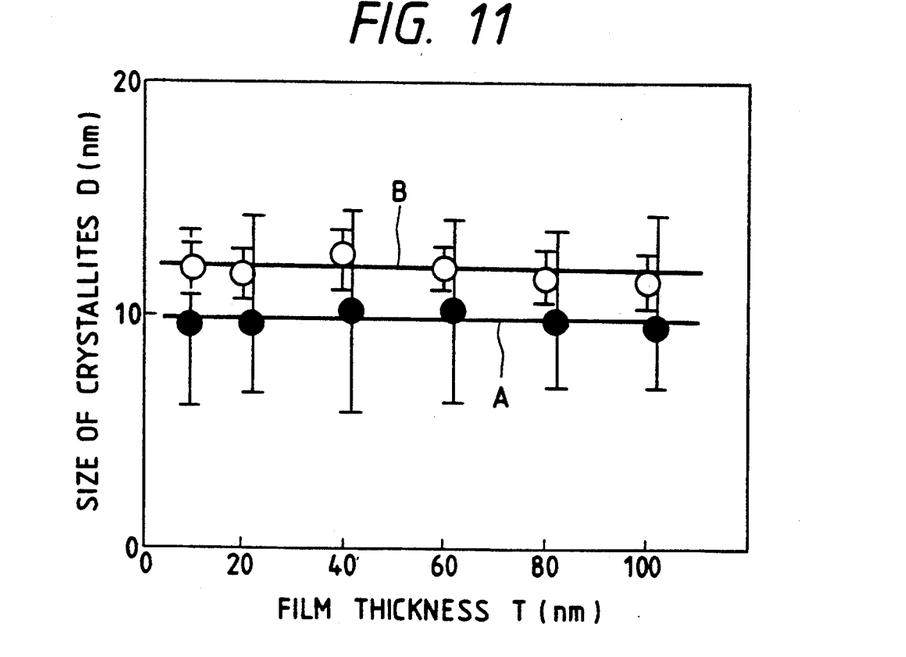
FIG. 11 shows a relationship between the film thickness of TFTs and crystallites of the invention.

Using the laser anneal equipment shown in FIG. 9, amorphous silicon films having the thicknesses of 10, 20, 40, 60 and 100 mm have been crystallized. Film growth on a glass substrate through the plasma CVD method was carried out, using hydrogen $H_2$ and monosilane $SiH_4$ as starting material gases, at pressures of 80 Pa, substrate temperatures of 300° C., and RF power densities of 60 W. Because an amorphous silicon film grown by the plasma CVD method contains a large quantity of hydrogen in the film, the same silicon film is bombarded with high power laser beams, which, however, causes peeling off of the film. Thereby, a pretreatment process for reducing hydrogen contents was added prior to the laser annealing. As such pretreatment processes, there are such methods as heat annealing at approximately 400° C., irradiation of continuous oscillation laser beams and so on. In this embodiment of the invention, however, heat annealing was conducted at 400° C. in nitrogen atmosphere for 15 minutes, to reduce the hydrogen density in the film less than 9%. Then, the sample was set in the equipment shown in FIG. 9 to be subjected to the laser annealing in the same manner as the above process embodying the invention. Crystallinity of the polycrystalline silicon films thus obtained is shown in FIG. 10. The axis of ordinates in FIG. 10 indicates a sum of diffraction intensities from (111), (220) and (311) planes divided by a film thickness, whereas the axis of abscissas indicates film thicknesses of amorphous silicon films. It is found from FIG. 10 that, in comparison with a characteristic curve A obtained by the conventional method without heating the substrate, a characteristic curve B according to the embodiment of the invention indicates that the amorphous silicon films have been crystallized uniformly throughout the films regardless of film thicknesses. Further, a relationship between the size of crystallites and the film thickness to be calculated using the half-value width of a peak value in the X-ray diffraction is shown in FIG. 11, with the size of crystals being in nm on the axis of ordinates and the film thickness being in nm on the axis of absoissas. As a result, it is revealed that a characteristic curve B showing a relationship between the size of crystals and the film thickness obtained for the example embodying the invention has been able to attain constant values of approximately 12 nm in the crystal size regardless of the film thickness, thereby providing more improved uniformity in crystals than that by the conventional method indicated by a characteristic curve A. By way of explanation, the crystalline refers to a microscopic substance representing an initial stage of crystal growth. The same effect has been attained according to the present embodiment as that according to the previously set forth embodiment.

Application of this method to the previously described process for growing thin film transistors (TFTs) of the first embodiment of the invention will be set forth in the following.

Figure 12:
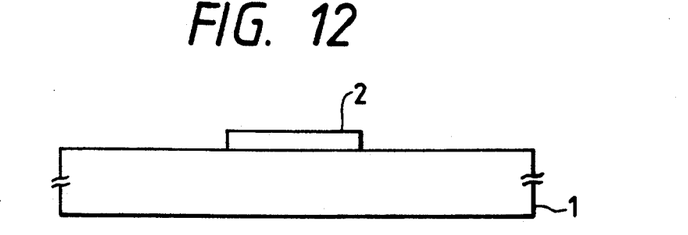
FIG. 12 shows a cross-sectional view of a TFT in a fabrication process (at the time of gate electrode deposition) according to the present invention.
Figure 13:
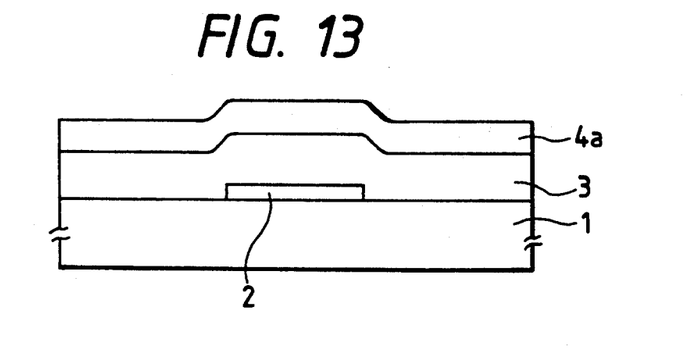
FIG. 13 shows a cross-sectional view of a TFT in a fabrication process (at the time of silicon film crystallization) according to the present invention.
Figure 14:
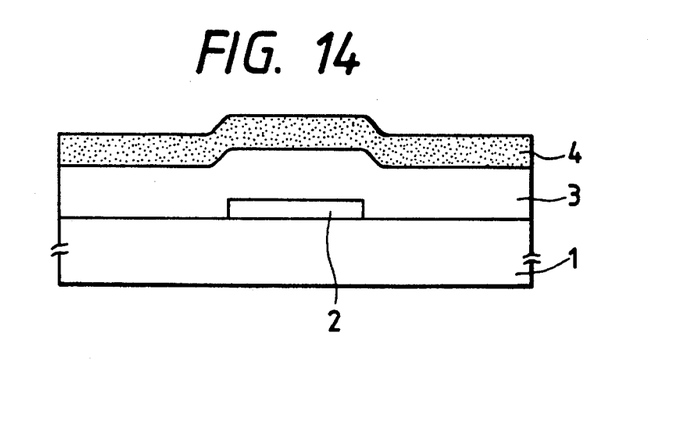
FIG. 14 shows a cross-sectional view of a TFT in a fabrication process (after silicon film crystallization) according to the present invention.
Figure 15:
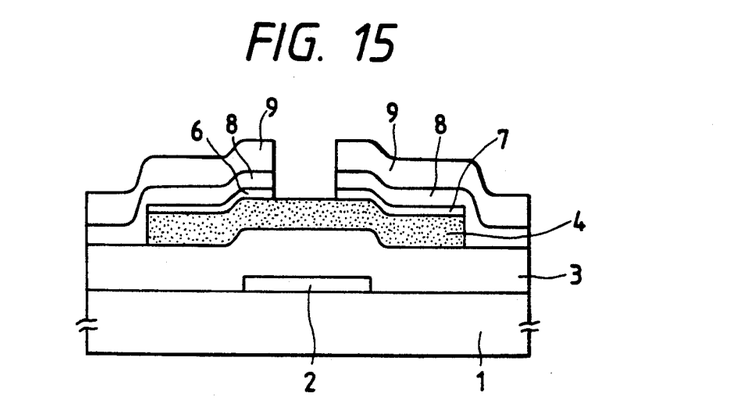
FIG. 15 shows a schematic cross-sectional view of a TFT according to the present invention.

A Cr film 2 to serve as a gate electrode is deposited on the glass substrate 1 to a thickness of 120 nm by the sputtering method, and the same is etched to define a gate electrode pattern by the photo-etching method as shown in FIG. 12. Then, a SiN film 3 to serve as a gate insulator film, and an amorphous silicon film 4a to serve as a semiconducting active layer are deposited consecutively as shown in FIG. 13. The growth conditions for the SiN film 3 were: substrate temperatures at 350° C., gas flow rates at $SiH_4$ 10 sccm, $NH_3$ 60 sccm, $N_2$ 200 sccm, and a film thickness by deposition of 3500 nm. The growth conditions for the amorphous silicon film 4a were as follows. Substrate temperatures at 300° C., gas flow rates for $H_2$ at 200 sccm, $SiH_4$ at 70 sccm, and film thickness of deposition to 100 nm. Then, after reducing hydrogen contents by heat treatment, the sample was crystallized according to the method of the invention, in the equipment of FIG. 9. By blowing Ar gas cooled under room temperatures in the chilling mechanism 82 onto the surface of the sample, heating the substrate at 300° C., and irradiating XeCl excimer laser at power densities of 260 mJ/cm$^2$, a temperature gradient was introduced into the amorphous silicon film 4a so that the temperature in the substrate side became higher and that in the surface side became lower. FIG. 14 shows a cross-sectional view of the structure of the amorphous silicon film 4a after the same was crystallized into a polycrystalline silicon film 4. After that, n type silicon films 6, 7 were deposited thereupon to a thickness of 40 nm at 230° C. by the plasma CVD method, and etched to define a prescribed pattern by the photo-etching method. Then, Cr film 8 and Al film 9 to serve as source/drain electrodes were deposited by the sputtering method at 100° C., the former to a thickness of 60 nm and the latter to a thickness of 370 nm. After the above process, Al film 9 and Cr film 8 were selectively etched to define the source/drain patterns through the photoetching process, then the n type silicon film was dry etched to leave portions 6,7 by the dry etching method to form a channel region. A cross-sectional view of the structure thus obtained is shown in FIG. 15.

After fabricating TFTs, in order to remove intrinsic charges in the SiN films, the same were heat treated in $N_2$ at 200° C. for one hour. Then, a relationship between the gate voltage and drain current was measured. As the result, the characteristics of TFTs formed on a glass substrate of 200 mm 260 mm size were found to have been greatly improved so as to have field effect mobilities of $45\pm10 cm^2/V.s$ and threshold voltages of $2.4\pm0.4V$. On the other hand, when laser annealed in vacuum without heating the substrate, TFTs thus formed have smaller and largely varied field effect mobilities of an average of 15 $cm^2/V.s$, with the maximum value of 52$cm^2/V$ s and the minimum value of 8 $cm^2/V.s$. As explained above, according to the embodiment of the present invention, it is possible to fabricate TFTs having excellent electrical properties.

In each of the above embodiments of the invention, the temperature for heating the substrates during laser annealing was set at 300° C. Any heating temperature, however, may be selected only if it permits that heat radiation, from the film undergoing recrystallization during laser annealing, in the vertical direction (perpendicular to the substrate plane) is uniform. Further, through cooling non-oxidizing gases such as inert gases supplied from the ambient gas supply system 81 in the chilling mechanism 82, cooling the surface of the film undergoing recrystallization and facilitating heat radiation therefrom, in combination with the heating of the substrates, the rate of heat radiation from the film is capable of being controlled. The substrate heating temperatures, however, when in use of glass as the substrate, must be controlled not to exceed deformation points (for instance, in case of Corning 7059 glass, below approximately 600° C.), and when in use of silicon substrates, the temperatures must be controlled lower than their melting points.

According to the present invention, both off-current (I off) and reverse leakage current (I rev) in TFTs have been able to be reduced substantially while maintaining the carrier mobility at a large value. Eventually, the related peripheral drivers circuits have been permitted to be built in the liquid crystal display substrate or image processor substrate.

Further, when fabricating TFTs according to the fabrication method of the present invention, at the time of laser annealing of an amorphous semiconductor film, the amorphous semiconductor film being heated from the substrate side, recrystallization of the film will proceed also from the surface of the film thereby permitting reforming of the amorphous semiconductor film to a polycrystalline semiconductor film having a uniform grain size and its distribution also in a vertical direction, hence providing advantages capable of fabricating thin film semiconductor devices having excellent electrical properties, uniform grain sizes and their homogeneous distribution.

We claim:

1. A thin film semiconductor device having an inverted stagger structure provide with a gate electrode on an insulation substrate, a gate insulation film, a channel region, a source region and a drain region,
   wherein said channel region includes a polycrystalline silicon layer and an amorphous silicon layer, said polycrystalline silicon layer being in contact with the gate insulation film, said amorphous silicon layer being in contact with the source and drain regions,
   wherein the polycrystalline silicon layer and the amorphous silicon layer form an interface therebetween extending in a horizontal plane, and
   wherein an unevenness in the interface between said polycrystalline silicon layer and said amorphous silicon layer is characterized by being 50Å or less per 1000Å of a horizontal distance.

2. A thin film semiconductor device as claimed in claim 1, wherein
   said polycrystalline silicon film is characterized by having a thickness from 100Å to 500Å.

3. A thin film semiconductor device as claimed in claim 1, wherein
   in a vicinity of an interface between the polycrystalline silicon layer and the amorphous silicon layer, crystal grain size of said polycrystalline silicon layer is substantially uniform.

4. A thin film semiconductor device as claimed in claim 3, wherein the amorphous silicon layer is a layer positioned on the polycrystalline silicon layer, having an interface region adjacent said interface, the interface region having a hydrogen concentration as deposited, and wherein the interface region of the amorphous silicon layer of the thin film semiconductor device has a hydrogen concentration that is the same as that of the interface region at the time the interface region was deposited.

5. A thin film semiconductor device as claimed in claim 1, wherein the conductivity type of said polycrystalline silicon layer is p-type.

6. A thin film semiconductor device as claimed in claim 1, wherein said polycrystalline silicon layer is in contact with the amorphous silicon layer.

7. A thin film semiconductor device as claimed in claim 1, wherein the insulation substrate is a glass substrate.

8. A thin film semiconductor device having an inverted stagger structure provided with a gate electrode on an insulator substrate, a gate insulation film, a channel region, a source region and a drain region, wherein
   said channel region includes a polycrystalline silicon layer, and has amorphous silicon layers and an insulation layer both formed on said polycrystalline silicon layer, wherein said amorphous silicon layers beneath said source and drain regions, said amorphous silicon layers being separated from each other with said insulation layer therebetween, wherein said polycrystalline silicon layer is provided on the gate insulation film, wherein the polycrystalline silicon layer and the amorphous silicon layers form an interface therebetween extending in a horizontal plane, and wherein an unevenness in the interface between said polycrystalline silicon layer and said amorphous silicon layers is characterized by being 50Å or less per 1000Å of a horizontal distance.

9. A display device comprising: a thin film semiconductor device with an inverted stagger structure provided with a gate electrode on an insulator substrate, a gate insulation film, a channel region, a source region and a drain region, said channel region having a two-layered structure of a polycrystalline silicon layer in contact with the gate insulation film, and an amorphous silicon layer; and a pixel portion composed of an a-Si layer formed on said insulator substrate, wherein the polycrystalline silicon layer and the amorphous silicon layer form an interface therebetween extending in a horizontal plane, and wherein an unevenness in the interface between said polycrystalline silicon layer and said amorphous silicon layer is characterized by being 50Å or less per 1000Å of a horizontal distance.

10. A display device as claimed in claim 9, wherein said thin film semiconductor device forms a peripheral circuit of the display device.

11. An image sensor having a peripheral circuit and readout diode each formed on an insulator substrate, wherein the peripheral circuit includes a thin film semiconductor device having an inverted stagger structure provided with a gate electrode on the insulator substrate, a gate insulation film, a channel region, a source region and a drain region, and wherein said channel region includes a polycrystalline silicon layer and an amorphous silicon layer, said polycrystalline silicon layer being in contact with the gate insulation film, said amorphous silicon layer being in contact with the source and drain regions, wherein the polycrystalline silicon layer and the amorphous silicon layer form an interface therebetween extending in a horizontal plane, and wherein an unevenness in the interface between said polycrystalline silicon layer and said amorphous silicon layer is characterized by being 50Å or less per 1000Å of a horizontal distance.

12. A display device having a pixel region and a peripheral circuit region formed on an insulator substrate, wherein each of the pixel region and peripheral circuit region includes thin film semiconductor devices having an inverted stagger structure provided with a gate electrode on the insulator substrate, a gate insulation film, a channel region, a source region and a drain region, and wherein said channel region includes a polycrystalline silicon layer and an amorphous silicon layer, said polycrystalline silicon layer being in contact with the gate insulation film, said amorphous silicon layer being in contact with the source and drain regions, wherein the polycrystalline silicon layer and the amorphous silicon layer form an interface therebetween extending in a horizontal plane, and wherein an unevenness in the interface between said polycrystalline silicon layer and said amorphous silicon layer is characterized by being 50Å or less per 1000Å of a horizontal distance.

13. A thin film semiconductor device having an inverted stagger structure, comprising:

a polycrystalline silicon layer formed on a gate insulation film;

an amorphous silicon layer formed on said polycrystalline silicon layer; and a source drain and a drain region, separated from each other, on a top surface of said amorphous silicon layer, electrically connected with each other by way of said amorphous silicon layer.

14. A thin film semiconductor device as claimed in claim 13, wherein said gate insulation film is provided on a gate electrode.

15. A thin film semiconductor device as claimed in claim 13, wherein said source region and said drain region each directly contact said amorphous silicon layer.

16. A thin film semiconductor device as claimed in claim 15, wherein said amorphous silicon layer is in direct contact with said polycrystalline silicon layer.

17. A thin film semiconductor device as claimed in claim 13, wherein said amorphous silicon layer is in direct contact with said polycrystalline silicon layer.

18. A thin film semiconductor device as claimed in claim 13, wherein said amorphous silicon layer extends between the source region and the drain region.

19. A thin film semiconductor device as claimed in claim 13, wherein the polycrystalline silicon layer has a film thickness of 100Å-500Å.

20. A thin film semiconductor device having an inverted stagger structure, comprising:

a polycrystalline silicon layer formed on a gate insulation film, a first amorphous silicon layer formed on said polycrystalline silicon layer, a second amorphous silicon layer, separated from said first amorphous silicon layer, on said polycrystalline silicon layer, a source region formed on a top surface of said first amorphous silicon layer, a drain region formed on a top surface of said second amorphous silicon layer; and an insulation layer, composed of a material which is not etched by materials that etch silicon, formed at least on a surface region of said polycrystalline silicon layer between said source region and said drain region.

21. A thin film semiconductor device as claimed in claim 20, wherein said insulation layer is formed extending an entire distance between said source region and said drain region.

22. A thin film semiconductor device as claimed in claim 20, wherein said source and drain regions respectively directly contact the first and second amorphous silicon layers.

23. A thin film semiconductor device as claimed in claim 22, wherein each of the first and second amorphous silicon layers directly contacts said polycrystalline silicon layer.

24. A thin film semiconductor device as claimed in claim 20, wherein the insulation layer extends between the first and second amorphous silicon layers.

* * * * *